United States Patent
Aoki et al.

(10) Patent No.: US 7,710,197 B2
(45) Date of Patent: May 4, 2010

(54) LOW OFFSET ENVELOPE DETECTOR AND METHOD OF USE

(75) Inventors: Ichiro Aoki, San Clemente, CA (US); Setu Mohta, Tustin, CA (US); Morten Damgaard, Laguna Hills, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 58 days.

(21) Appl. No.: 11/827,187

(22) Filed: Jul. 11, 2007

(65) Prior Publication Data

US 2009/0015328 A1    Jan. 15, 2009

(51) Int. Cl.
*H03F 3/45* (2006.01)
(52) U.S. Cl. .................... 330/252; 330/251; 330/260
(58) Field of Classification Search ................ 330/130, 330/289, 296, 347, 207 A, 251, 252; 329/347
See application file for complete search history.

(56) References Cited

U.S. PATENT DOCUMENTS

| | | | |
|---|---|---|---|
| 3,098,200 A | 7/1963 | Jensen |
| 3,157,839 A | 11/1964 | Brown |
| 3,430,157 A | 2/1969 | Wood |
| 3,449,685 A | 6/1969 | Holmes |
| 3,652,947 A | 3/1972 | Hollingsworth |
| 3,703,685 A | 11/1972 | Simopoulos et al. |
| 3,919,656 A | 11/1975 | Sokal et al. |
| 3,919,660 A | 11/1975 | Beurrier |
| 3,967,161 A | 6/1976 | Lichtblau |
| 4,117,415 A | 9/1978 | Hoover |
| 4,165,493 A | 8/1979 | Harrington |
| 4,181,889 A | 1/1980 | Davis et al. |
| 4,283,685 A | 8/1981 | MacMaster et al. |
| 4,305,043 A | 12/1981 | Ho et al. |
| 4,330,754 A | 5/1982 | Hartley |
| 4,607,323 A | 8/1986 | Sokal et al. |

(Continued)

FOREIGN PATENT DOCUMENTS

DE    12 76 764 B    9/1968

(Continued)

OTHER PUBLICATIONS

Search Report for PCT/US01/31813 dated Jun. 17, 2003, 9 pages.

(Continued)

*Primary Examiner*—Joseph Chang
*Assistant Examiner*—Jeffrey Shin
(74) *Attorney, Agent, or Firm*—Jackson Walker L.L.P.; Christopher J. Rourk (57) ABSTRACT

A system for processing a signal is provided. The system includes a differential amplifier receiving a radio-frequency input signal at a first differential input. A rectifying device such as a transistor has a control terminal that is coupled to an output of the differential amplifier and an output that is coupled to a second differential input of the differential amplifier. The second differential input of the differential amplifier receives a low frequency feedback signal from the output of the rectifying device, such as by damping the frequency response at the output of the rectifying device using a capacitor and a current source coupled to the output of the rectifying device.

20 Claims, 3 Drawing Sheets

U.S. PATENT DOCUMENTS

| | | |
|---|---|---|
| 4,694,261 A | 9/1987 | Ewen et al. |
| 4,706,038 A | 11/1987 | Navidi et al. |
| 4,717,884 A | 1/1988 | Mitzlaff |
| 4,772,856 A | 9/1988 | Nojima et al. |
| 4,916,410 A | 4/1990 | Littlefield |
| 4,994,755 A | 2/1991 | Titus et al. |
| 4,994,760 A | 2/1991 | Roehrs |
| 5,060,298 A | 10/1991 | Waugh et al. |
| 5,066,925 A | 11/1991 | Freitag |
| 5,115,204 A * | 5/1992 | Tomonaga .................. 330/257 |
| 5,130,664 A | 7/1992 | Pavlic et al. |
| 5,146,178 A | 9/1992 | Nojima et al. |
| 5,208,725 A | 5/1993 | Akcasu |
| 5,223,800 A | 6/1993 | Karsten, Jr. et al. |
| 5,254,881 A | 10/1993 | Leonowich |
| 5,327,337 A | 7/1994 | Cripe |
| 5,389,890 A | 2/1995 | Burrage |
| 5,469,115 A | 11/1995 | Peterzell et al. |
| 5,477,370 A | 12/1995 | Little et al. |
| 5,479,134 A | 12/1995 | Nishioka et al. |
| 5,483,197 A | 1/1996 | Nishioka et al. |
| 5,525,871 A | 6/1996 | Bray et al. |
| 5,600,575 A | 2/1997 | Anticole |
| 5,612,647 A | 3/1997 | Malec |
| 5,698,469 A | 12/1997 | Mohwinkel et al. |
| 5,742,205 A | 4/1998 | Cowen et al. |
| 5,749,051 A | 5/1998 | Dent |
| 5,781,071 A | 7/1998 | Kusunoki |
| 5,793,253 A | 8/1998 | Kumar et al. |
| 5,825,248 A | 10/1998 | Ozawa |
| 5,872,481 A | 2/1999 | Sevic et al. |
| 5,920,240 A | 7/1999 | Alexanian et al. |
| 5,926,068 A | 7/1999 | Harr |
| 5,939,766 A | 8/1999 | Stolmeijer et al. |
| 5,973,557 A | 10/1999 | Miyaji et al. |
| 6,008,703 A | 12/1999 | Perrott et al. |
| 6,011,438 A | 1/2000 | Kakuta et al. |
| 6,020,787 A | 2/2000 | Kim et al. |
| 6,057,571 A | 5/2000 | Miller et al. |
| 6,107,885 A | 8/2000 | Miguelez et al. |
| 6,114,911 A | 9/2000 | Iwai et al. |
| 6,121,842 A | 9/2000 | Adlerstein et al. |
| 6,121,843 A | 9/2000 | Vampola et al. |
| 6,137,354 A | 10/2000 | Dacus et al. |
| 6,160,455 A | 12/2000 | French et al. |
| 6,203,516 B1 | 3/2001 | Kepley |
| 6,211,728 B1 | 4/2001 | Chen et al. |
| 6,211,747 B1 | 4/2001 | Trichet et al. |
| 6,229,718 B1 | 5/2001 | Nilssen |
| 6,232,841 B1 | 5/2001 | Bartlett et al. |
| 6,252,455 B1 | 6/2001 | Kurby et al. |
| 6,320,913 B1 | 11/2001 | Nakayama |
| 6,351,185 B1 | 2/2002 | Amrany et al. |
| 6,369,651 B1 | 4/2002 | Dent |
| 6,383,858 B1 | 5/2002 | Gupta et al. |
| 6,385,033 B1 | 5/2002 | Javanifard et al. |
| 6,400,227 B1 | 6/2002 | Goldfarb et al. |
| 6,408,168 B1 | 6/2002 | Sessink |
| 6,417,535 B1 | 7/2002 | Johnson et al. |
| 6,424,227 B1 | 7/2002 | El-Sharawy |
| 6,430,403 B1 * | 8/2002 | Kossor ....................... 455/126 |
| 6,445,248 B1 | 9/2002 | Gilbert |
| 6,448,847 B1 | 9/2002 | Paul et al. |
| 6,498,534 B1 | 12/2002 | Kim et al. |
| 6,509,722 B2 * | 1/2003 | Lopata ....................... 323/280 |
| 6,538,510 B1 | 3/2003 | Amrany et al. |
| 6,549,112 B1 | 4/2003 | Gallina et al. |
| 6,556,089 B2 | 4/2003 | Wood |
| 6,577,219 B2 | 6/2003 | Visser |
| 6,653,891 B1 * | 11/2003 | Hazucha ..................... 327/540 |
| 6,707,367 B2 | 3/2004 | Casteneda et al. |
| 6,717,998 B2 | 4/2004 | Adachi et al. |
| 6,724,255 B2 | 4/2004 | Kee et al. |
| 6,756,849 B2 | 6/2004 | Dupuis et al. |
| 6,762,645 B1 | 7/2004 | Grant |
| 6,784,732 B2 | 8/2004 | Hajimiri et al. |
| 6,798,305 B2 | 9/2004 | Aikawa et al. |
| 6,809,586 B1 | 10/2004 | Hobboosh et al. |
| 6,812,771 B1 | 11/2004 | Behel et al. |
| 6,815,910 B2 | 11/2004 | Suzuki |
| 6,816,012 B2 | 11/2004 | Aoki et al. |
| 6,825,726 B2 | 11/2004 | French et al. |
| 6,856,199 B2 | 2/2005 | Komijani et al. |
| 6,909,882 B2 | 6/2005 | Hayashi et al. |
| 6,917,245 B2 * | 7/2005 | Dupuis et al. ............... 330/279 |
| 6,940,355 B2 | 9/2005 | Hajimiri et al. |
| 6,982,605 B2 | 1/2006 | Mondal et al. |
| 6,999,747 B2 | 2/2006 | Su |
| 7,058,374 B2 | 6/2006 | Levesque et al. |
| 7,062,237 B2 | 6/2006 | Brandt |
| 7,092,692 B2 | 8/2006 | Tan et al. |
| 7,095,819 B2 | 8/2006 | Bellaouar et al. |
| 7,129,784 B2 | 10/2006 | Bhatti et al. |
| 7,224,237 B2 | 5/2007 | Hirano et al. |
| 7,272,375 B2 | 9/2007 | Tuttle et al. |
| 7,274,253 B2 | 9/2007 | Pan |
| 7,276,966 B1 | 10/2007 | Tham et al. |
| 7,330,072 B2 | 2/2008 | Brandt |
| 2002/0042256 A1 | 4/2002 | Baldwin et al. |
| 2002/0125945 A1 | 9/2002 | Taylor |
| 2002/0135422 A1 | 9/2002 | Aoki et al. |
| 2002/0173337 A1 | 11/2002 | Hajimiri et al. |
| 2003/0003952 A1 | 1/2003 | Kim |
| 2003/0021367 A1 | 1/2003 | Smith |
| 2003/0045263 A1 | 3/2003 | Wakayama et al. |
| 2003/0130006 A1 | 7/2003 | Reynolds |
| 2003/0169113 A1 | 9/2003 | Komijani et al. |
| 2003/0184369 A1 | 10/2003 | Aoki et al. |
| 2004/0081256 A1 | 4/2004 | Shi et al. |
| 2004/0178852 A1 | 9/2004 | Neunaber |
| 2005/0064840 A1 | 3/2005 | Heydari et al. |
| 2005/0070325 A1 | 3/2005 | Bellaouar et al. |
| 2005/0107043 A1 | 5/2005 | Avasarala et al. |
| 2005/0212791 A1 * | 9/2005 | Tsuchi ....................... 345/211 |
| 2006/0066396 A1 | 3/2006 | Brandt |
| 2006/0068734 A1 | 3/2006 | Toyoda et al. |
| 2006/0103457 A1 | 5/2006 | Kumar et al. |
| 2006/0115018 A1 | 6/2006 | Kang et al. |
| 2007/0170989 A1 * | 7/2007 | Pan ........................... 330/257 |
| 2008/0012602 A1 * | 1/2008 | Presti et al. .................. 327/58 |

FOREIGN PATENT DOCUMENTS

| | | |
|---|---|---|
| EP | 0 379 202 A2 | 7/1990 |
| EP | 0 430 707 A2 | 6/1991 |
| EP | 0 458 071 A1 | 11/1991 |
| EP | 0 556 398 A1 | 8/1993 |
| EP | 0 643 494 A1 | 3/1995 |
| EP | 0 961 412 A1 | 1/1999 |
| EP | 1 345 375 A2 | 9/2003 |
| FR | 1 413 073 A | 10/1965 |
| GB | 2 126 816 A1 | 3/1984 |
| JP | 06-224605 | 8/1994 |
| JP | 2917949 | 7/1998 |
| JP | 2001-44862 | 2/2001 |
| WO | WO 97/02654 | 1/1997 |
| WO | WO 97/22177 | 6/1997 |
| WO | WO 01/06644 | 1/2001 |
| WO | WO01/56171 | 8/2001 |
| WO | WO 2005/098880 | 10/2005 |

OTHER PUBLICATIONS

Robertson et al., "Solid State Power Amplifier Using Impedance-Transforming Branch-Line Couplers for L-Band Satellite Systems,"

Proceedings of the 23$^{rd}$ European Microwave Conference, Madrid, Sep. 6-9, 1993, Proceedings of the European Microwave Conference, Turnbridge Wells, Reed Exhibition Company, GB, Sep. 6, 1993, pp. 448-450, XP00629961, ISBN: 0-946821-23-2 Figures 1, 3.

Long et al., "The Modeling, Characterization and Design of Monolithic Inductors for Silicon RF IC's," IEEE Journal of Solid-State Circuits, vol. 32, No. 3, pp. 357-369, Mar. 1997.

Portilla et al., "High Power-Added Efficiency MMIC Amplifier for 2.4 GHz Wireless Communications," IEEE Journal of Solid State Circuits, vol. 34, No. 1, Jan. 1999.

King-Chun Tsai et al., "A 1.9-GHz, 1-W CMOS Class-E Power Amplifier for Wireless Communications," IEEE Journal of Solid State Circuits, vol. 34, No. 7,, pp. 962-970, Jul. 1999.

Simbürger et al., A Monolithic Transformer Coupled 5-W Silicon Power Amplifier with 59% PAE at 0.9 GHz, IEEE Journal of Solid-State Circuits, vol. 34, No. 12, pp. 1881-1892, Dec. 1999.

Simbürger et al., "A Monolithic 2.5 V, 1 W Silicon Bipolar Power Amplifier With 55% PAE at 1.9 GHz," IEEE MTT-S Digest, pp. 853-856, 2000.

Yoo et al., "A Common-Gate Switched, 0.9W Class-E Power Amplifier with 41% PAE in 0.25 μm CMOS," Integrated Systems Laboratory (IIS), Swiss Federal Institute of Technology (ETH), Zurich Switzerland, 2000 Symposium on VLSI Circuits Digest of Technical Papers, pp. 56 & 57, 2000.

PCT International Search Report for PCT/US06/20297, mailed Oct. 11, 2008, 3 pgs.

Long, "Monolithic Transformers for Silicon RF IC Design," IEEE Journal of Solid-State Circuits, vol. 35, No. 9, pp. 1368-1382, Sep. 2000.

Tan et al., "A 900 MHz Fully-Integrated SOI Power Amplifier for Single-Chip Wireless Transceiver Applications," IEEE Journal of Solid-State Circuits, vol. 35, No. 10, pp. 1481-1486, Oct. 2000.

Gupta et al., "Design and Optimization of CMOS RF Power Amplifiers," IEEE Journal of Solid-State Circuits, vol. 36, No. 2, pp. 166-175, Feb. 2001.

Aoki et al., "A 2-4-GHz, 2.2-W, 2-V Fully-Integrated CMOS Circular-Geometry Active-Transformer Power Amplifier," Submitted to CICC-IEEE Custom Integrated Circuits Conference, San Diego, May 6-9, 2001, Department of Electrical Engineering, California Institute of Technology, Pasadena, CA 91125, USA May 6-9, 2001.

Kee et al., "7-MHz, 1.1-kW Demonstration of the New E/F$_{2,odd}$ Switching Amplifier Class," Department of Electrical Engineering, California Institute of Technology, Pasadena, CA 92115, 2001.

Translation of Japanese Office Action (Notice of Reasons for Refusal) mailed Dec. 11, 2007 (4 pgs.).

Search Report for PCT/US03/07157 dated Mar. 29, 2004, 4 pgs.

Aoki et al., "Distributed Active Transformer—A new Power-Combination and Impedance-Transformation Technique," IEEE Transactions on Microwave Theory and Techniques, vol. 50, No. 1, pp. 316-331, Jan. 2002.

Park et al., "Peak Detectors for Multistandard Wireless Receivers," IEEE Circuits and Devices Magazine, Nov./Dec. 2006, pp. 6-9.

PCT International Search Report in PCT/US03/07140 (a related application) mailed Jul. 10, 2003, 7 pgs.

"Advances in Solid-State Power Supplies for RF Heating," Electronics & Wireless World, Reed Business Publishing, Sutton, Surrey, GB, vol. 94, No. 1632, Oct. 1, 1988, pp. 1013-1015, 22 (XP000001939).

Watanabe et al., "Analysis on a PWM Power Conversion Amplifier with IGBT Macro Model to Generate Gradient Magnetic Fields in MRI Systems," Power Electronics and Drive Systems, 1999, PEDS '99, Proceedings of the IEEE 1999 International Conference on Hong Kong, Jul. 27-29, 1999, Piscataway, NJ, USA, IEEE, US, pp. 127-132 (XP010352078).

Patent Abstracts of Japan, vol. 2002, No. 03, Apr. 3, 2002 & JP 2001 308649 A (Sharp Corp), Nov. 2, 2001, abstract.

Patent Abstracts of Japan, vol. 1995, No. 03, Apr. 28, 1995 & JP 06 334446 A (Mori Shinsaku), Dec. 2, 1994, abstract.

Patent Abstracts of Japan, vol. 1999, No. 02, Feb. 26, 1999 & JP 10 308639 A (Sony Corp), Nov. 17, 1998, abstract.

Asbeck, P., "Device and Circuit Approaches for Next-Generation Wireless Communications," Technical Feature, reviewed by Microwave Journal Editorial Board, Feb. 1999, 7 pgs.

Iwadare et al., "Even Harmonic Resonant Class E Tuned Power Amplifier Without RF Choke," Electronics and Communications in Japan, Part 1, vol. 79, No. 1, Jan. 1995.

Radisic et al., "Novel Architectures for High-Efficiency Amplifiers for Wireless Applications," IEEE Transactions on Microwave Theory and Techniques, vol. 46, No. 11, Nov. 1998, pp. 1901-1909.

Roufougaran, "A 900 MHz RF Power Amplifier in 1 μm CMOS for a Spread-Spectrum Communication Transceiver," (A thesis submitted in partial satisfaction of the requirements for the degree Master of Science in Electrical Engineering) The University of California, Los Angeles, CA, Aug. 1995, 14 pgs.

Trask, "Class-F Amplifier Loading Networks: A Unified Design Approach," ATG Design Services, P.O. Box 25240, Tempe, Arizona 85285-5240, Jun. 1999, pp. 1-4.

http://www.ece.ucsb.edu/rad/classe.html, RF Circuit Design at UC Santa Barbara: Jul. 16, 1999 (Revised Dec. 10, 1999), pp. 1-2.

Wei et al., "Analysis and Experimental Waveform Study on Inverse Class Class-F Mode of Microwave Power Fets," Alpha Industries, Inc., Woburn, MA, 2000 IEEE MTT-S Digest, Jun. 2000, p. 525-528.

Inoue et al., "High-Efficiency 0.1 cc Power Amplifier Module for 900 MHz Personal Digital Cellular Telephones," IEICE Trans. Electron, vol. E82-C, No. 11, Nov. 1999, p. 1906-1912.

Inoue et al., Analysis of Class-F and Inverse Class-F Amplifiers, High Frequency and Optical Semiconductor Division, Mitsubishi Electric Corporation, Japan, 2000 IEEE MTT-S Digest, Jun. 2000, pp. 775-778.

Raab, "Class-E, Class-C, and Class-F Power Amplifiers Based upon a Finite Number of Harmonics," IEEE Transactions on Microwave Theory and Techniques, vol. 49, No. 8, Aug. 2001, pp. 1462-1468.

PCT International Search Report and Written Opinion, PCT/US2004/035794, mailed Mar. 10, 2005, 11 pgs.

PCT International Search Report and Written Opinion, PCT/US2005/003519, mailed Jun. 9, 2005, 12 pgs.

Itoh et al., "Even Harmonic Type Direct Conversion Receiver ICs for Mobile Handsets: Design Challenges and Solutions," 1999 IEEE Radio Frequency Integrated Circuits Symposium, Jul. 1999, pp. 53-56.

Matinpour et al., "A Low-Power Direct Conversion Receiver Module for C-Band Wireless Applications," 2001 IEEE Radio Frequency Integrated Circuits Symposium, Aug. 2001, pp. 263-266.

Tokumitsu et al., "A Low-Voltage, High-Power T/R Switch MMIC Using LC Resonators," IEEE Transactions on Microwave Theory and Techniques, vol. 43, No. 4, May 1995.

Kuhn et al., "A Resonant Switch for LNA Protection in Watt-Level CMOS Transceivers," IEEE Transactions on Microwave Theory and Techniques, vol. 53, No. 9, Sep. 2005.

PCT International Search Report and Written Opinion for PCT/US08/69623 mailed Mar. 20, 2009, 17 pgs.

PCT International Search Report and Written Opinion for PCT/US08/69615, mailed Nov. 5, 2008, 16 pgs.

PCT International Search Report and Written Opinion for PCT/US07/19472, mailed Mar. 26, 2008, 12 pgs.

PCT International Search Report and Written Opinion for PCT/US07/19473, mailed Mar. 26, 2008, 12 pgs.

PCT International Search Report and Written Opinion for PCT/US09/031108, mailed Jul. 10, 2009, 8 pgs.

* cited by examiner

FIGURE 1

PRIOR ART

FIGURE 2

PRIOR ART

FIGURE 5

LOW OFFSET ENVELOPE DETECTOR AND METHOD OF USE

RELATED APPLICATIONS

This application is related to U.S. patent application Ser. No. 11/655,000, filed Jan. 18, 2007, entitled "System and Method for Power Amplifier Output Power Control," now U.S. Pat. No. 7,486,137, and U.S. patent application Ser. No. 11/654,744, filed Jan. 18, 2007, entitled "System and Method for Power Amplifier Output Power Control."

FIELD OF THE INVENTION

The invention is related to envelope detectors, and more particularly to a low offset envelope detector and method of use.

BACKGROUND OF THE INVENTION

Envelope detectors are known in the art. Envelope detectors can be used to generate an output signal representing the envelope level or amplitude of a high frequency input signal. This can be used in many applications, such as demodulating an amplitude modulated input signal, detecting the strength of a received radio frequency (RF) signal, detecting the level of a generated RF signal for use in amplitude leveling loops, detecting the level of a generated RF signal for use in an amplitude feedback loop such as in a polar modulator, or for other suitable applications.

Figure 1:
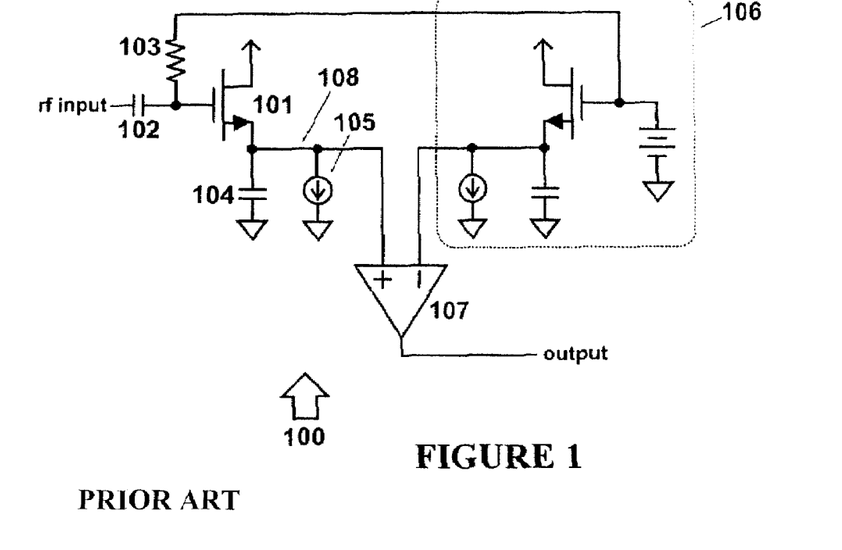
FIG. 1 is a schematic diagram of a prior art envelope detector.

FIG. 1 is a schematic diagram of a prior art envelope detector 100. Envelope detector 100 comprises rectifying transistor 101, capacitor 102, resistor 103, holding capacitor 104, bias current source 105, optional DC offset replica circuit 106, and optional subtracting amplifier 107. Rectifying transistor 101 is configured to receive at a first terminal a bias voltage through resistor 103 and an input RF signal through capacitor 102. The first terminal of rectifying transistor 101 can be the gate if rectifying transistor 101 is a field-effect transistor (FET), the base if rectifying transistor 101 is a bipolar junction transistor (BJT), or other suitable control terminals for other devices.

A second terminal of rectifying transistor 101 is connected to holding capacitor 104 at an output node 108 and provided a bias current from bias current source 105. The second terminal of rectifying transistor 101 can be the source if rectifying transistor 101 is a FET, or the emitter if rectifying transistor 101 is a BJT. Holding capacitor 104 is selected such that the response time of the voltage at output node 108 is substantially slower than the period of frequency of the RF input. By using a nonlinear rectifying transistor 101, the average voltage at output node 108 can respond to the amplitude of the input RF signal.

Output node 108 can have a DC voltage even when the RF input amplitude is zero. For instance, if rectifying transistor 101 is a FET, the DC voltage at output node 108 can be approximately one threshold voltage below the bias voltage applied to the gate of rectifying transistor 101 when the RF input amplitude is zero. This DC offset can be detrimental if a small amplitude of the RF input is to be measured. Optional DC offset replica circuit 106, which can contain replicas of rectifying transistor 101 and bias current source 105, can be used to replicate this DC voltage. Optional subtracting amplifier 107 can then be used to remove this offset voltage from the output signal representing the detected envelope.

Figure 2:
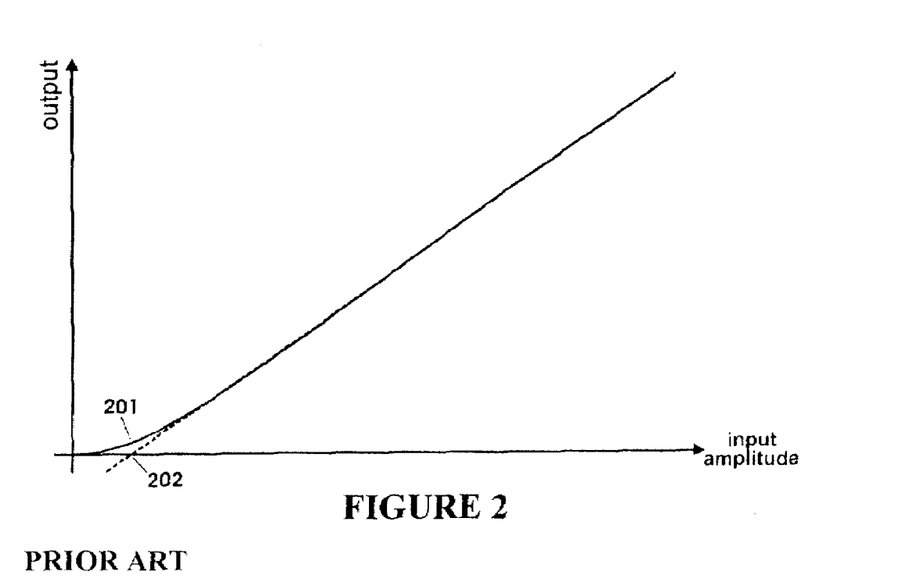
FIG. 2 is a diagram of curve showing a typical response of a prior-art envelope detector.

FIG. 2 is a diagram of curve 201 showing a typical response of a prior art envelope detector, such as envelope detector 100. Curve 201 depicts the voltage output, such as the output of subtracting amplifier 107, versus an RF input amplitude, such as the amplitude of the RF input signal coupled to rectifying transistor 101. This curve can typically be linear for a sufficiently large input amplitude, but can deviate from this linear response when the input amplitude is small. This nonlinearity can have an effect similar to an offset voltage, such that the extrapolated response of the high input amplitude range crosses the x axis at a non-zero point 202 while the actual response begins to curve. This effect can be caused when rectifying transistor 101 is not receiving a large enough signal amplitude for the transistor to operate as a nonlinear device, and can cause the average voltage output by the envelope detector to be nearly independent of the input RF signal amplitude until the amplitude reaches a sufficient level so that the rectifying device begins to behave in a nonlinear fashion.

There are at least two different sources of offset, as shown by curve 201. One is caused by the DC bias point of the detector output not typically being zero, so that even when there is no RF input, the voltage at 108 is nonzero. This offset can be corrected using a replica circuit to generate the same DC value using like circuitry and subtracting this off of the detected value.

Nevertheless, curve 201 will remain at zero even for a small nonzero input amplitude, due to the signal level being too small to activate the nonlinearity of transistor 101. The detector output DC does not change until the amplitude gets large enough so that transistor 101 becomes nonlinear and begins to re-bias the voltage 108 in response to changes in input amplitude.

This offset voltage effect can be detrimental when very small input signals must be detected. The offset voltage can also degrade performance of systems even when the input RF amplitude is typically high enough that the envelope detector is operating in the linear region, because the output in this region is proportional to the input amplitude minus the effective offset voltage. In systems such as polar feedback loops, it can be necessary that this offset voltage be nearly zero. An RF amplifier could be used to increase the amplitude of the RF input signal presented to the envelope detector in order to reduce this effect, but the application of an RF amplifier in this manner can cause other issues, such as saturation of the RF signal when higher amplitudes are present, and nonlinearity of the input to output response of the amplifier.

SUMMARY OF THE INVENTION

Therefore, it is desirable to have an envelope detector which can detect the amplitude of an input RF signal with reduced offset voltage.

In particular, an envelope detector is provided which generates a low offset when small signal amplitudes are received at the input of the envelope detector.

In accordance with an exemplary embodiment of the present invention, a system for processing a signal is provided. The system includes a differential amplifier receiving a radio-frequency input signal at a first differential input. A rectifying device such as a transistor has a control terminal that is coupled to an output of the differential amplifier and an output that is coupled to a second differential input of the differential amplifier. The second differential input of the differential amplifier receives a low frequency feedback signal from the output of the rectifying device, such as by damping the frequency response at the output of the rectifying device using a capacitor and a current source coupled to the output of the rectifying device.

The present invention provides many important technical advantages. One important technical advantage of the present invention is a system utilizing an envelope detector with a low offset at low magnitude inputs, so as to avoid generation of a non-linear response between the input amplitude and the output voltage.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

Figure 3:
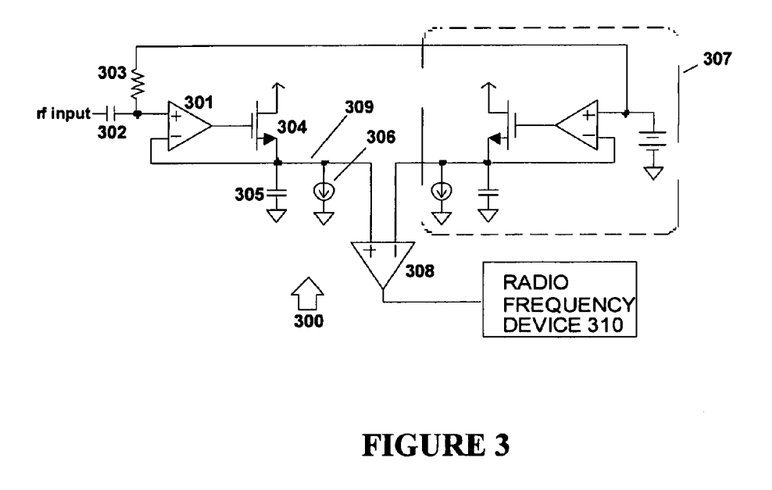
FIG. 3 is a diagram of an envelope detector in accordance with an exemplary embodiment of the present invention.

FIG. 3 is a diagram of envelope detector 300 in accordance with an exemplary embodiment of the present invention. Envelope detector 300 includes differential amplifier 301, capacitor 302, resistor 303, rectifying device 304, capacitor 305, optional replica circuit 307, and optional subtracting amplifier 308.

Differential amplifier 301 receives an RF input signal at a first input through capacitor 302 and a bias voltage through resistor 303. Differential amplifier 301 is configured so that the input RF signal is amplified at the output of differential amplifier 301. Differential amplifier 301 receives a feedback signal generated by rectifying device 304 at a second input. The feedback signal is related to detected signal level. Differential amplifier 301 is configured so that the voltage presented at its second input is amplified at its output.

The output of differential amplifier 301 is coupled to a first terminal of rectifying device 304. The first terminal of rectifying device 304 can be a gate if rectifying device 304 is a FET, a base if rectifying device 304 is a BJT, or other suitable control terminals. A second terminal of rectifying device 304 is connected to capacitor 305 at an output node 309 and provided a bias current from current source 306. The second terminal of rectifying device 304 can be the source if rectifying device 304 is a FET, or the emitter if rectifying device 304 is a BJT. The size of capacitor 305 can be selected so that the response time of the voltage at output node 309 is substantially slower than the period of frequency of the RF input. By using a nonlinearity of rectifying device 304, the average voltage at output node 309 can respond to the amplitude of the RF signal present at the first terminal of rectifying device 304. The feedback signal provided to the second input of differential amplifier 301 can be the signal at output node 309 or another suitable signal derived from the signal at output node 309, such as a divided or amplified signal.

Optional replica circuit 307 can include a mirror duplicate of rectifying device 304, differential amplifier 301 and current source 306, that is used to replicate a DC offset voltage. Optional subtracting amplifier 308 can then be used to remove this offset voltage from the output signal representing the detected envelope. The detected signal can then be provided as an indication of the detected envelope to a device 310, such as a cellular telephone receiver, a cellular telephone transmitter, a polar transmission loop, a broadband wireless transceiver, television set, computer, or other suitable devices.

The use of differential amplifier 301 receiving a low frequency feedback signal from output node 309 can have benefit by reducing the offset voltage associated with the limited nonlinearity of rectifying device 304 when presented with small input signals. Because differential amplifier 301 can have signal gain at the frequency of the RF input signal, the amplitude at the first terminal of rectifying device 304 can have a larger amplitude than if differential amplifier 301 were not used. This signal gain can improve the offset voltage when small amplitude signals are present at the RF input.

The use of a feedback signal into the second input of differential amplifier 301 can provide the benefit of avoiding saturation at the peak of the amplified RF signal, which can occur at the output of differential amplifier 301 such as may occur if an amplifier with no feedback signal is used. Differential amplifier 301 can be configured to subtract the amplified feedback signal from the amplified input RF signal at its output. Since the feedback signal can increase as the input RF amplitude increases, the peak value of the signal at the output of differential amplifier 301 can increase less with increasing RF input signal amplitude than without using the feedback signal. In this manner, envelope detector 300 can be used at higher levels of input amplitude than if a conventional RF amplifier were used.

Figure 4:
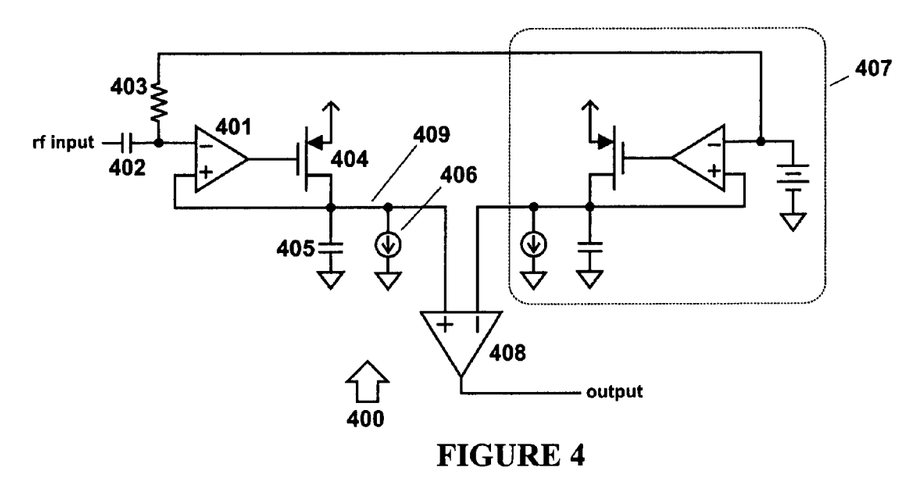
FIG. 4 is a diagram of an envelope detector in accordance with an exemplary embodiment of the present invention.

FIG. 4 is a diagram of envelope detector 400 in accordance with an exemplary embodiment of the present invention. Envelope detector 400 includes differential amplifier 401, capacitor 402, resistor 403, rectifying device 404, capacitor 405, optional replica circuit 407, and optional subtracting amplifier 408.

Differential amplifier 401 receives an RF input signal at a first input through capacitor 402 and a bias voltage through resistor 403. Differential amplifier 401 is configured so that the input RF signal is amplified at its output. Differential amplifier 401 receives a feedback signal generated by rectifying device 404 at a second input that is related to detected signal level. Differential amplifier 401 is configured so that the voltage presented at its second input is amplified at its output.

The output of differential amplifier 401 is coupled to a first terminal of rectifying device 404. The first terminal of rectifying device 404 can be a gate if rectifying device 404 is a FET, or a base if rectifying device 404 is a BJT. A second terminal of rectifying device 404 is connected to capacitor 405 at an output node 409 and is provided a bias current from bias current source 406. The second terminal of rectifying device 404 can be the drain if rectifying device 404 is a FET, or the collector if rectifying device 404 is a BJT. Capacitor 405 controls the response time of the change in voltage at output node 409 so that it is substantially slower than the period of frequency of the RF input. By using a nonlinear response of rectifying device 404, the average current provided by rectifying device 404 into output node 409 can respond to the amplitude of the RF signal present at the first terminal of rectifying device 404. The feedback signal provided to the second input of differential amplifier 401 can be the signal at output node 409 or another suitable signal derived from the signal at output node 409, such as a divided or amplified signal.

Envelope detector 400 can produce an output related to the amplitude of the input RF signal. The current provided by rectifying device 404 can increase with increasing amplitude of the RF input signal due to a nonlinearity of rectifying device 404. The difference between this current and bias current source 406 can flow into capacitor 405, so that the difference in current can result in an output signal at output node 409 which is the current difference integrated with respect to time.

Differential amplifier 401 allows an increasing feedback signal present at its second input to result in a change in output voltage effecting a reduction in the average current of rectifying device 404. For instance, if rectifying device 404 is a p-type FET, differential amplifier 401 can cause the voltage at the gate of rectifying device 404 to increase with increasing voltage at output node 409. The feedback through the second terminal of differential amplifier 401 can reach a steady state so that the additional current induced by the amplitude of the input RF signal can be compensated by a reduced current due to the feedback signal, to provide an output signal that increases as the amplitude of the RF signal increases.

Optional replica circuit 407, which can contain replicas of rectifying device 404, differential amplifier 401 and bias current source 406, or other suitable devices, can be used to replicate a DC offset voltage. Optional subtracting amplifier 408 can then be used to remove this offset voltage from the output signal representing the detected envelope.

Envelope detector 400 provides similar linearity benefits as envelope detector 300. Any offset voltage resulting from insufficient nonlinearity of rectifying device 404 can be reduced by the RF gain of differential amplifier 401. Feedback to the second terminal of differential amplifier 401 can be used to ensure that peaks of the RF signal do not cause saturation at the output of differential amplifier 401 for large amplitude input RF signals. Envelope detector 400 can provide the additional benefit of increasing the effectiveness of the feedback loop through differential amplifier 401 due to increased gain from configuring output node 409 as an integrator.

In one embodiment, rectifying device 404 is configured so that its third terminal is a source or an emitter connected to fixed voltage, such as ground or a supply voltage. This can have the benefit of reducing the variation of the voltage level required to be generated by differential amplifier 401. Since the instantaneous current generated by rectifying device 404 can be a function of the difference in the voltages at the device's first terminal and the fixed voltage at the device's third terminal, the steady state condition can be such that the voltage levels present at the first terminal of rectifying device 404 which produce the rectified current can be similar over a wide range of amplitude of the RF input, which can provide the benefit of reducing the requirements of differential amplifier 401 to produce a wide range of output voltage.

Figure 5:
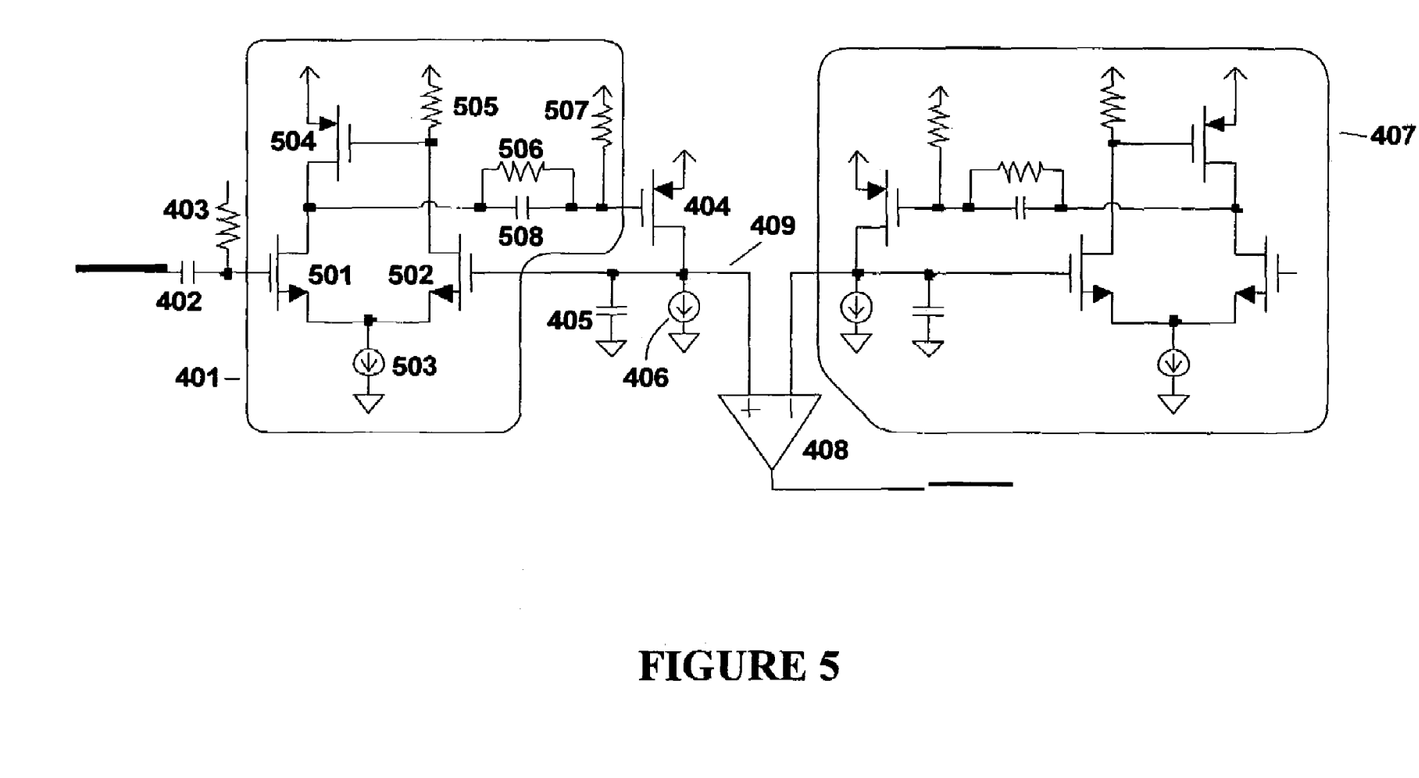
FIG. 5 is a diagram of an envelope detector in accordance with an exemplary embodiment of the present invention.

FIG. 5 is a diagram of an envelope detector 500 in accordance with an exemplary embodiment of the present invention.

Differential amplifier 401 can be implemented using transistors 501, 502 and 504, resistors 505, 506 and 507, and capacitor 508. Transistors 501, 502 and 504 can be FETs, BJTs, or other suitable devices. Transistors 501 and 502 form a differential pair by connecting a source terminal of transistor 501 with a source terminal of transistor 502. Transistors 501 and 502 are provided a bias current from bias current source 503. Transistor 501 is configured to receive the RF input signal through capacitor 402, while transistor 502 is configured to receive the feedback signal from output node 409. Resistor 505 receives an amplified current from transistor 502 to generate a voltage, which is provided to a gate, base or other suitable control terminal of transistor 504. A drain, collector or other suitable terminal of transistor 504 is connected to a drain, collector or other suitable terminal of transistor 501 to produce a voltage. This voltage is applied to a first terminal of resistor 506 and a first terminal of capacitor 508. The second terminal of resistor 506, the second terminal of capacitor 508, and a first terminal of resistor 507 are connected to form an output node, which is coupled to the first terminal of rectifying device 404. The second terminal of resistor 507 can be connected to a supply voltage or another suitable voltage.

Differential amplifier 401 can amplify the RF input signal through transistor 501 and capacitor 508. This short signal path provides the benefit of reducing the coupling of the RF signal to capacitive devices or intrinsic capacitances, such as may occur in a multi-stage amplifier. This reduction in capacitance can provide a high gain relative to the supply current used.

The feedback signal can be amplified through transistor 502, resistor 505, transistor 504, and resistor 506. Resistor 507 can be used to modify the gain from transistor 504 to the first terminal of rectifying device 404, such as to modify the DC level of the voltage present at the drain or collector of transistor 504, which helps to avoid transistor 504 entering a triode operation region if transistor 504 is a FET, or to avoid transistor 504 going into saturation if transistor 504 is a BJT. Capacitor 508 can be used to bypass resistor 506 in order to achieve a higher gain at the frequency of the RF input signal.

In one alternate embodiment, resistor 505 can be replaced with a diode-connected transistor. This can have benefit by reducing the circuit size if envelope detector 500 is implemented in an integrated circuit. It can also have benefit by reducing the loop gain variation due to mismatch between resistor 505 and transistor 504.

In view of the above detailed description of the present invention and associated drawings, other modifications and variations are apparent to those skilled in the art. It is also apparent that such other modifications and variations may be effected without departing from the spirit and scope of the present invention.

What is claimed is:

1. A system for processing a signal comprising:
    a differential amplifier receiving a radio-frequency input signal at a first differential input;
    a non-linear rectifying device having a control terminal coupled to an output of the differential amplifier and an output coupled to a second differential input of the differential amplifier;
    amplification circuitry, coupled to the output of the differential amplifier and the control terminal of the non-linear rectifying device, having higher gain at radio frequency than at low frequency; and
    wherein the second differential input of the differential amplifier receives a low frequency feedback signal from the output of the rectifying device.

2. The system of claim 1 further comprising a capacitor coupled to the output of the rectifying device.

3. The system of claim 1 further comprising a current source coupled to the output of the rectifying device.

4. The system of claim 1 wherein the differential amplifier is configured to provide a predetermined signal gain at the frequency of the radio-frequency input signal.

5. The system of claim 1 wherein the low frequency feedback signal prevents saturation of the differential amplifier at a peak value of the amplified radio-frequency signal.

6. The system of claim 1 further comprising a replica circuit coupled to the differential amplifier for removing a DC offset from the output of the rectifying device, the replica circuit further comprising a replica differential amplifier coupled to the differential amplifier and receiving the radio frequency input signal at a first differential input.

7. The system of claim 6 further comprising:
a replica rectifying device having a control terminal coupled to an output of the replica differential amplifier and an output coupled to a second differential input of the replica differential amplifier; and
wherein the second differential input of the replica differential amplifier receives a low frequency feed hack signal from the output of the replica rectifying device.

8. The system of claim 1 wherein the differential amplifier comprises:
a first transistor receiving the radio frequency input signal;
a second transistor receiving the low frequency feedback signal; and
a third transistor having an input terminal coupled to a DC voltage source, an output terminal coupled to the first transistor and the control terminal of the rectifying device, and a control terminal coupled to an input terminal of the second transistor.

9. A method for processing a signal comprising:
generating an output based on the difference between a radio frequency input and a low frequency feedback input;
amplifying the output with an amplifier circuit having higher stain at radio frequency than at low frequency;
controlling a control terminal of a rectifying device using the amplified output; and
utilizing a nonlinearity of the rectifying device to generate the low frequency feedback signal from the output of the rectifying device.

10. The method of claim 9 wherein generating the low frequency feedback signal from the output of the rectifying device comprises damping the frequency response at the output of the rectifying device.

11. The method of claim 9 wherein generating the low frequency feedback signal from the output of the rectifying device comprises capacitively damping the frequency response at the output of the rectifying device.

12. The method of claim 9 further comprising generating a replica differential output based on the difference between a bias voltage input and a replica low frequency feedback input.

13. The method of claim 12 further comprising:
controlling a control terminal of a replica rectifying device using the replica differential output; and
generating the replica low frequency feedback signal from the output of the replica rectifying device.

14. The method of claim 13 further comprising using the output of the rectifying device and the output of the replica rectifying device to remove a DC offset from the output of the rectifying device.

15. A system for processing a signal comprising:
means for receiving a radio-frequency input signal and a low frequency feedback signal and generating an output based on the difference between radio frequency input and the low frequency feedback signal;
means for amplifying the output with an amplifier circuit having higher gain at radio frequency than at low frequency;
means for receiving the amplified output and generating a rectified signal; and
means for receiving the rectified signal and generating the low frequency feedback signal.

16. The system of claim 15 further comprising means for generating a DC offset signal.

17. The system of claim 15 wherein the means for receiving the rectified signal and generating the low frequency feedback signal comprises means for capacitively controlling the frequency of the rectified signal.

18. The system of claim 15 wherein the means for receiving the radio-frequency input signal and the low frequency feedback signal and generating the differential output comprises means for amplifying the feedback signal.

19. The system of claim 15 wherein the means for receiving the radio-frequency input signal and the low frequency feedback signal and generating the differential output comprises means for preventing saturation at a peak value of the radio-frequency signal.

20. The system of claim 16 wherein the means for generating a DC offset signal comprises second means for receiving the radio-frequency input signal and a second low frequency feedback signal and generating a second differential output.

* * * * *

UNITED STATES PATENT AND TRADEMARK OFFICE
CERTIFICATE OF CORRECTION

PATENT NO. : 7,710,197 B2  
APPLICATION NO. : 11/827187  
DATED : May 4, 2010  
INVENTOR(S) : Ichiro Aoki, Setu Mohta and Morten Damgaard

It is certified that error appears in the above-identified patent and that said Letters Patent is hereby corrected as shown below:

Col. 7, line 16, please change "feed hack" to -- feedback --;

Col. 7, line 33, please change "stain" to -- gain --.

Signed and Sealed this

Fifteenth Day of June, 2010

David J. Kappos  
*Director of the United States Patent and Trademark Office*